United States Patent
Illing et al.

(10) Patent No.: US 7,863,072 B2
(45) Date of Patent: Jan. 4, 2011

(54) MICROMECHANICAL DIAPHRAGM SENSOR HAVING A DOUBLE DIAPHRAGM

(75) Inventors: Matthias Illing, Kusterdingen (DE); Heribert Weber, Nuertingen (DE); Christoph Schelling, Stuttgart (DE); Heiko Stahl, Reutlingen (DE); Stefan Weiss, Tübingen (DE)

(73) Assignee: Robert Bosch GmbH, Stuttgart (DE)

( * ) Notice: Subject to any disclaimer, the term of this patent is extended or adjusted under 35 U.S.C. 154(b) by 415 days.

(21) Appl. No.: 11/884,563

(22) PCT Filed: Dec. 21, 2005

(86) PCT No.: PCT/EP2005/057023
§ 371 (c)(1),
(2), (4) Date: Sep. 15, 2008

(87) PCT Pub. No.: WO2006/087045
PCT Pub. Date: Aug. 24, 2006

(65) Prior Publication Data
US 2009/0206422 A1  Aug. 20, 2009

(30) Foreign Application Priority Data
Feb. 18, 2005  (DE) .............. 10 2005 007 540

(51) Int. Cl.
*H01L 21/00* (2006.01)

(52) U.S. Cl. .................. 438/53; 438/48; 438/421; 438/700; 257/E21.553; 257/E21.573; 257/E21.581

(58) Field of Classification Search ............ 438/55, 438/61, 81, 411, 422, 749, 911
See application file for complete search history.

(56) References Cited

U.S. PATENT DOCUMENTS

| 4,665,610 A | 5/1987 | Barth et al. |
| 6,306,773 B1 * | 10/2001 | Adås et al. .................. 438/745 |
| 2005/0082626 A1 * | 4/2005 | Leedy .................. 257/432 |

FOREIGN PATENT DOCUMENTS

| DE | 102 00 40 433 56 | 3/2006 |
| EP | 1 043 770 | 10/2000 |
| EP | 1 441 561 | 7/2004 |

* cited by examiner

*Primary Examiner*—Walter L Lindsay, Jr.
*Assistant Examiner*—Cheung Lee
(74) *Attorney, Agent, or Firm*—Kenyon & Kenyon LLP

(57) ABSTRACT

A method for producing a micromechanical diaphragm sensor, and a micromechanical diaphragm sensor produced with the method. The micromechanical diaphragm sensor has at least one first diaphragm as well as a second diaphragm, which is disposed essentially on top of the first diaphragm. Furthermore, the micromechanical diaphragm sensor has a first cavity and a second cavity, which is essentially disposed above the first cavity.

16 Claims, 3 Drawing Sheets

MICROMECHANICAL DIAPHRAGM SENSOR HAVING A DOUBLE DIAPHRAGM

FIELD OF THE INVENTION

The present invention is to a method for producing a micromechanical diaphragm sensor or on a micromechanical diaphragm sensor produced on the basis of this method.

BACKGROUND INFORMATION

In particular in the automotive sector, components having micromechanical sensor elements are often used for detecting various physical quantities (pressure, temperature, air mass, acceleration, revolution speed). Typically, measuring elements on diaphragms disposed above a cavity are often utilized for this purpose. For the production of the diaphragm and the cavity, apart from so-called surface micromachining, in which stacks of layers made up of sacrificial layers and functional layers are deposited, patterned and selectively removed, so-called bulk micromachining is known as well, in which patterns are worked out of solid material.

From EP 1 043 770 A1, a method is discussed in which at least one trench is initially produced in a substrate using a first etching step. After passivation of the walls of the trench, the cavity is formed in the course of a second anisotropic etching step. Enlargement of the cavity can be carried out in a third etching step, which is also anisotropic, by removing the walls between a plurality of adjacent trenches.

In DE 102 00 40 433 56 A1, which is assigned to Bosch GmbH, to whom the present application is also assigned or under an obligation of assignment, and which is not prior art as to the present application, it is discussed how a buried cavity is produced with the aid of a single trench etching process. The trench etching process has a first trench etching step, which creates a depression. In the course of this first trench etching step, the etching step is implemented in two phases. In a first phase, an indentation is initially produced in alternation, whose walls are covered by a passivation agent in the second phase. Repetition of the two phases therefore produces the depression. The cavity is subsequently produced in the second trench etching step, the depression serving as access hole to the cavity. This is done by implementing the etching process of the first phase for a considerably longer period of time in the second trenching step, without a passivation taking place. By repeating the steps of this trench etching process, a plurality of caverns lying underneath the other is able to be produced in the substrate.

From EP 1441 561 A2, another method is known in which recesses or caverns disposed underneath one another are able to be produced. To this end, different layers are first deposited on a substrate. Using a masking metal layer, depressions are made in the deposited layer sequence. The depression is made with the aid of an anisotropic dry etching method. Starting from the depressions, cavities, which are interconnected underneath the deposited layers, are produced in the substrate by means of a subsequent isotropic etching process or by plasma etching. In another step, an opening in the substrate can be produced from the rear of the substrate. The two cavities may then be interconnected via an additional anisotropic etching process.

SUMMARY OF THE INVENTION

The present invention describes a method for producing a micromechanical diaphragm sensor or a micromechanical diaphragm sensor produced by the method. The micromechanical diaphragm sensor has at least one first diaphragm as well as a second diaphragm, which essentially lies on top of the first diaphragm. Furthermore, the micromechanical diaphragm sensor has a first cavity as well as a second cavity, which lies essentially above the first cavity. To produce the diaphragm sensor, a first protective layer is deposited on the substrate to begin with. At least one opening, which reaches through the entire first protective layer down to the substrate, is made in this first protective layer. Then, a first diaphragm layer is deposited on the first protective layer and patterned. This first diaphragm layer is at least partially provided with a second protective layer. At least one opening, which reaches down to the first diaphragm layer, is likewise produced in the second protective layer. A sacrificial layer, which is at least partially covered by a third protective layer, is thereupon deposited on the second protective layer. A second diaphragm layer is applied on the third protective layer, it being provided, in particular, that the second diaphragm layer be disposed above the sacrificial layer. At least one opening, which reaches down to the sacrificial layer, through the second diaphragm layer and the third protective layer, is introduced in the second diaphragm layer. The core of the present idea is to produce the two cavities of the diaphragm sensor in a single etching step by dissolving out a portion of the sacrificial layer, the first diaphragm layer and the substrate.

The advantage of the present invention is that the exposing of the diaphragms or the production of a double diaphragm in a surface micromachining process is able to be achieved by a single etching step from the front of the wafer or the substrate. The geometries that affect the functional parameters of the diaphragm sensor (such as clearance of the diaphragms, perforations, thickness of the diaphragm etc.) are individually defined in advance processes and not modified further in the exposing. Since the wafer or the substrate is processed only from the front in a surface micromechanical process, it is possible to use standardized equipment for handling the wafers. Damage to the fragile micromechanical structures is therefore less likely than with bulk micromachining processes in which the wafers are handled on and processed from both sides since an embracing of the wafer or a realignment of the processes with respect to the produced structures is not required.

In one development of the present invention, the first cavity in the substrate is produced underneath the openings in the first protective layer. The second cavity, which is produced by dissolving out the sacrificial layer, is disposed between the first and the second diaphragm (layer).

The first diaphragm of the provided diaphragm sensor is essentially formed by the first diaphragm layer, and the second diaphragm is essentially formed by the second diaphragm layer. However, it may also be provided that the two diaphragms have additional layers, for instance in the form of protective layers.

In another development of the present invention, the second and third protective layers are patterned in such a way that they frame the sacrificial layer in the region of the second cavity. The use of an etching process that does not attack the protective layer allows the defined production of the second cavity within a region that is delimited by the second and third protective layers.

In a further development of the present invention, the first and second protective layers frame the first diaphragm and thus define its lateral and vertical extension.

To produce the diaphragm sensor, it is provided that
the substrate has a semiconductor material, in particular silicon, and/or at least one of the protective layers has an oxide, in particular a thermal oxide, and/or
the first diaphragm layer has silicon, and/or
the sacrificial layer has silicon or silicon germanium and/or
the second diaphragm layer has a metal layer.

In an advantageous manner, the first and/or second diaphragm layer are/is produced using a CVD method. In particular, it may be provided that at least one of the two diaphragm layers is produced by LPCVD deposition. The diaphragm layer disposed on top of the layer stack may be made up of a multitude of layers. For instance, the diaphragm layer may be provided with an additional passivation layer to protect against environmental influences. The patterning of the first and/or second diaphragm layer is implemented using a trench process. In an advantageous manner, all method steps, in particular the etching process, are implemented from the front of the substrate. The etching process may be carried out with the aid of a fluorine-containing compound such as a fluorine-containing plasma ($SF_6$, $NF_3$) or, preferably, with the aid of spontaneously etching gases such as $ClF_3$ or $XeF_2$. To seal the openings in the first diaphragm layer, the thickness of the protective layer is selected as a function of the diameter of the openings. It is provided, in particular, that the thickness of the second protective layer is greater than one half of the diameter of the openings in the first diaphragm layer. The lateral and vertical extension of the first cavity in the substrate is advantageously defined via the etching duration of the single etching step. Another possible process step is the sealing of the openings through the second diaphragm layer and the third protective layer by applying an additional layer, so that the cavity produced by these openings is sealed.

In one development of the present invention, the buried first diaphragm is electrically contacted. To produce the electrical contacting, an opening is created down to the first diaphragm layer in the second protective layer. After applying the sacrificial layer, it is patterned in such a way that an electrically insulated region, which is later able to be electrically contacted, is produced in the sacrificial layer. The third protective layer, which largely encloses the electrically insulated region in the sacrificial layer, is then deposited. For the contacting a recess is provided in the third protective layer, which reaches down to the electrically insulating region in the sacrificial layer. Subsequently, to contact the insulated region in the sacrificial layer or to contact the first diaphragm, an electrically conductive, spatially restricted layer is applied in the region of the recess. This may be done in the form of bond pads, for example. In this context it is provided that this conductive, spatially restricted layer has no electrical connection to the second diaphragm layer.

Due to the production of two superposed, exposed diaphragms, a micromechanical diaphragm sensor in which both diaphragms are deflectable independently of one another is able to be produced.

In an advantageous manner, the first and the second cavity are connected to one another. This may be accomplished by an opening in the first diaphragm, for example.

The provided surface micromachining process for producing a double diaphragm makes is possible to improve the manufacturing tolerances, in particular the geometric parameters of the diaphragm structure. Furthermore, the development as surface micromachining process considerably reduces the handling and processing and thereby lowers the production costs. Special processing of the rear side, which normally is an essential component of bulk micromachining processes, entails dead zones for machine handling (such as pin lift), and yield losses due to damage to the front side. In the extreme case, processing of the wafer rear side or processing via openings through the wafer (so-called through-wafer etching) may require the use of complex carrier technology in which the wafer must be mounted on a carrier (wafer, foil, chuck) and processed together with this carrier. The manufacturing tolerances and the production reliability play an important role in the layer configuration of the sensors. For instance, the processes for demonstrators are shown in simplified form, without considering the reciprocal effects of process tolerances on the characteristics of the components. The exposing of two diaphragms, for example, may be achieved by two time etching processes in which one of the time etching processes is implemented from the front of the wafer and the other from the rear of the wafer. Since both processes exhibit variations with regard to the etching rate and since, in addition, differences are produced by handling the wafer, component tolerances due to the wafer handling cannot be ruled out. Using the provided invention, it is therefore possible to provide a controlled series production having high yield, due to the fact that complicated wafer handling of the type described is not required and the exposing of the two diaphragms is achieved by only a single etching step. As a result, the effects of the process fluctuations are able to be decoupled from the functional parameters of the diaphragm sensor.

DETAILED DESCRIPTION

In one exemplary embodiment, three functional layers are deposited on a substrate one after the other in order to produce the diaphragm sensor according to the present invention. The functional layers are the lower diaphragm, the sacrificial layer between the diaphragms, and the upper diaphragm. Intermediate layers, which separate the functional elements from each other, are required in addition to the three functional layers.

The lower, i.e., first, diaphragm and the sacrificial layer are preferably made from silicon since at least portions of the two layers must be removed when etching the sacrificial layer in order to expose the diaphragms. As an alternative, it is also possible to use materials such as SiGe, which may be removed during the etching of the sacrificial layer. The upper, i.e., second, diaphragm may be made from different materials, silicon being one of them. A preferred choice is a diaphragm that is under slight tensile stress, for instance an ONO structure (possibly with metal coating), such as it is used in mass flow sensors. But other combinations may be used as well, such as oxide/metal diaphragms or multi-layers made of insulators and conductive layers in order to provide electrical lines or electrodes for capacitive circuits.

Figure 1A:
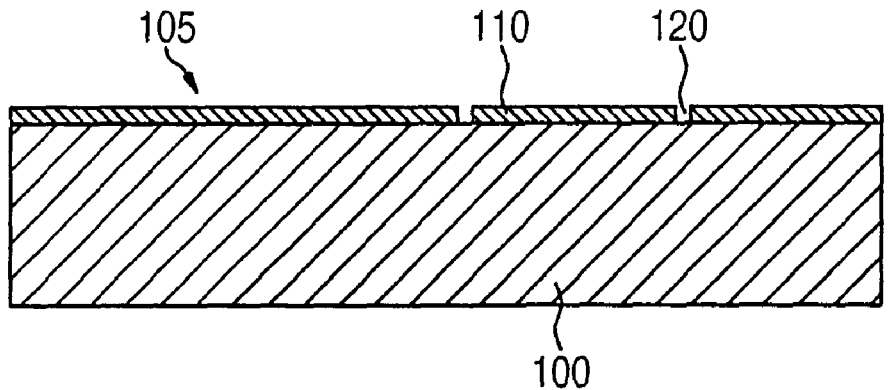
FIGS. 1a through 1g schematically illustrate the production method of the diaphragm sensor having a double diaphragm.

One possible manufacturing method of the micromechanical diaphragm sensor according to the present invention will be illustrated schematically with the aid of FIGS. 1a through 1g. As shown in FIG. 1a, the layer structure of the diaphragm sensor is realized by applying various layers on front side 105 of silicon substrate wafer 100. In a first step, the surface of silicon substrate wafer 100 is protected by depositing an oxide 110. The oxide may be produced by thermal oxidation, for example. One or a plurality of through holes 120 may be provided in this first protective layer 110, which are able to be utilized for the subsequent production of the first cavity.

Figure 1B:
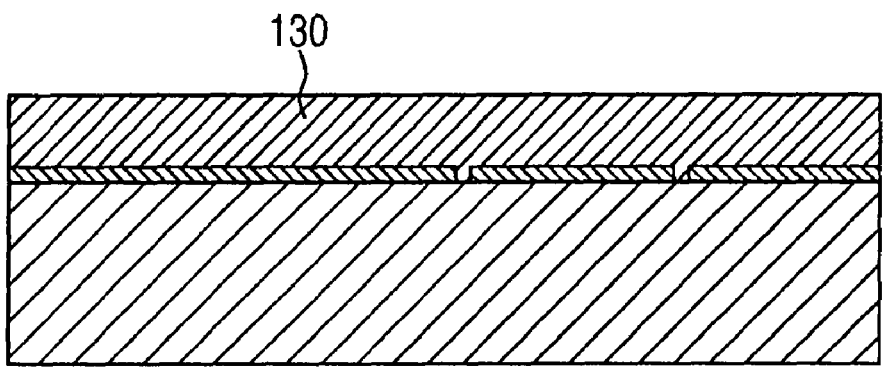
Figure 1C:
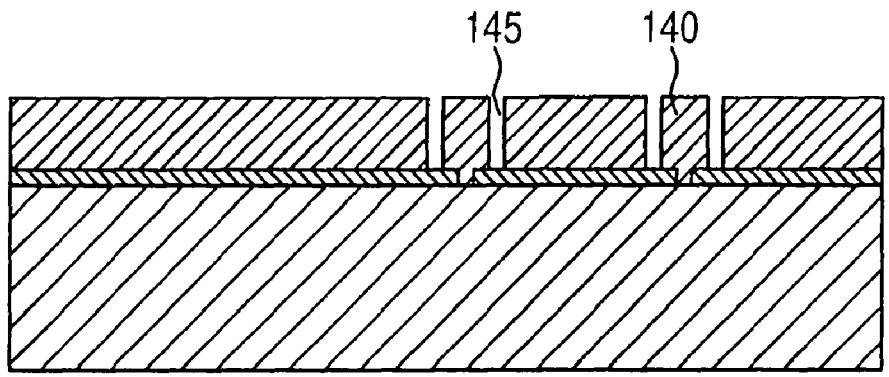
Figure 1D:
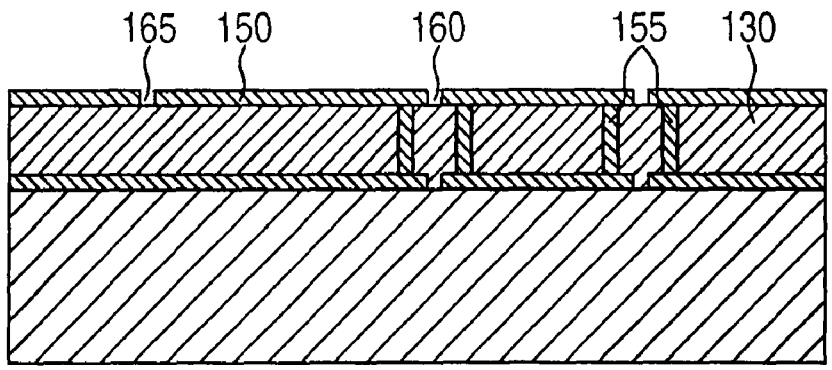

Next, a first diaphragm layer 130 is deposited on first protective layer 110 or in openings 120, as shown in FIG. 1b. This first diaphragm 130 layer will later constitute lower diaphragm 400. This first diaphragm layer 130 is deposited with the aid of epitaxial methods or with the aid of LPCVD deposition of silicon. The thickness of the layer of first diaphragm layer 130 is defined by the method parameters during the layer deposition. As shown in FIG. 1c, first diaphragm layer 130 is patterned, for instance with the aid of a trench etching process. This results in a perforation of the diaphragm, which defines regions 140 that are able to be removed during sacrificial layer etching. These regions are separated from actual diaphragm layer 400 by etching trenches 145. An additional layer 150 is deposited on patterned first diaphragm layer 130 (cf. FIG. 1d). By covering the first diaphragm layer, for instance by an oxide layer, etching trenches 145 are also filled completely. This may be achieved by thermal oxidation, in which the layer thickness of second protective layer 150 or the oxide thickness should be greater than one half of the trench width of the trenches, which are thereby able to be filled completely (cf. 155 in FIG. 1d). In order to create a connection between the sacrificial layer and the regions of the diaphragm to be etched, i.e., perforation (140) in first diaphragm layer 130, oxide layer 150 may likewise be patterned. In doing so, through holes 160 may be produced in the region of first diaphragm 400. For electrical contacting of first diaphragm 400, at least one through hole 165 may also be provided in the first protective layer or in oxide layer 150.

Figure 1E:
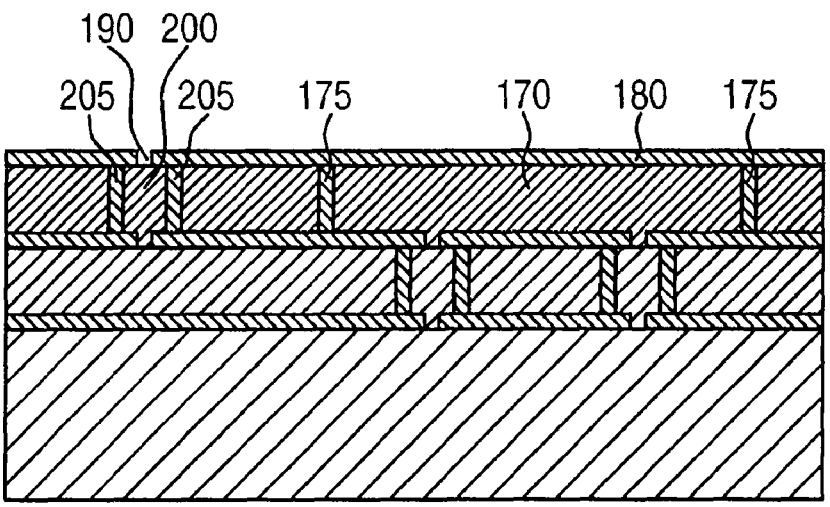

As shown in FIG. 1e, sacrificial layer 170 is deposited on second protective layer 150 and patterned. In doing so, the process steps may be carried out analogously to the deposition and patterning of lower diaphragm layer 130. Patterning of sacrificial layer 170 makes it possible to define a region for second cavity 310. Furthermore, a region 200 may be provided within sacrificial layer 170 for the electrical contacting of lower diaphragm 400. Another protective layer, or oxide layer 180, seals sacrificial layer 170 and simultaneously delimits the etching of the sacrificial layer in the lateral direction by trenches 175 filled with the oxide of oxide layer 180, so that only a defined area is undercut in etching, thereby defining the diaphragm rigidness in the layout or layer structure. Through holes 190 may be provided in third protective layer 180 in order to ensure access for the sacrificial layer etching, for instance, or to provide electrical contacts to the buried structures.

Figure 1F:
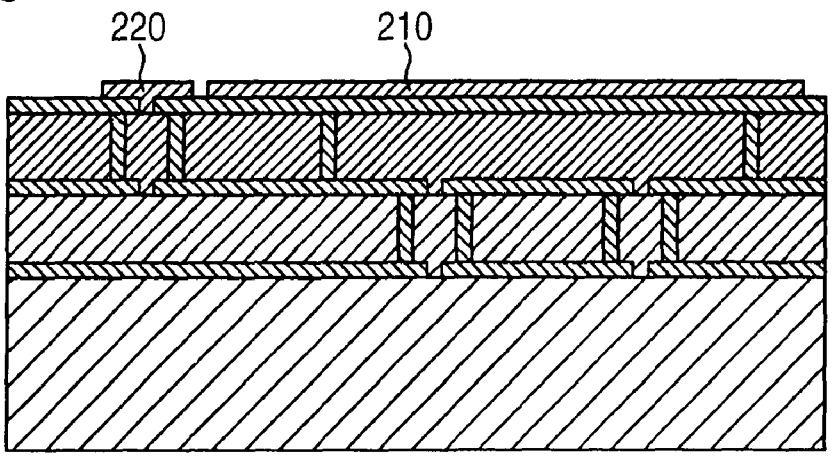

Subsequently, upper diaphragm layer 210 is deposited as uppermost layer. It may be made up of a single layer (such as a metal layer for forming a metal electrode) or a layer package (ONO diaphragm including metal layer, silicon layer having oxide passivation at the surface, etc.). Furthermore, it may also be provided that uppermost protective layer 180 constitute a portion of upper diaphragm 410. Upper diaphragm 410 usually has at least one metal layer 210 in the layer structure, which may also be used for the production of bond pads 220 for the electrical contacting of the component. As an alternative, an additional metallization serving the same purpose may be provided. Layer 210 in FIG. 1f is to represent the entire application-specific layer configuration of upper diaphragm 410; if appropriate, third protective layer 180 may be counted as part of the diaphragm as well.

Figure 1G:
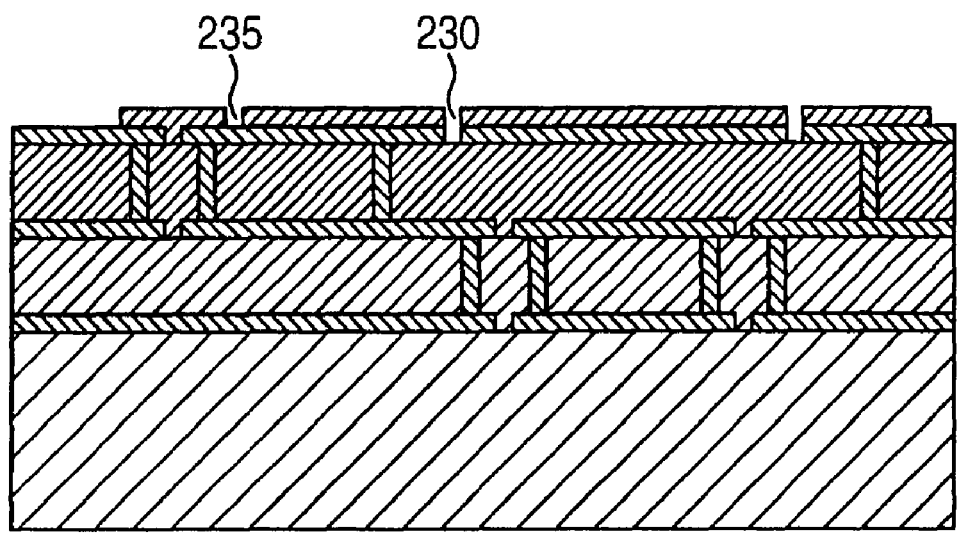
Figure 2:
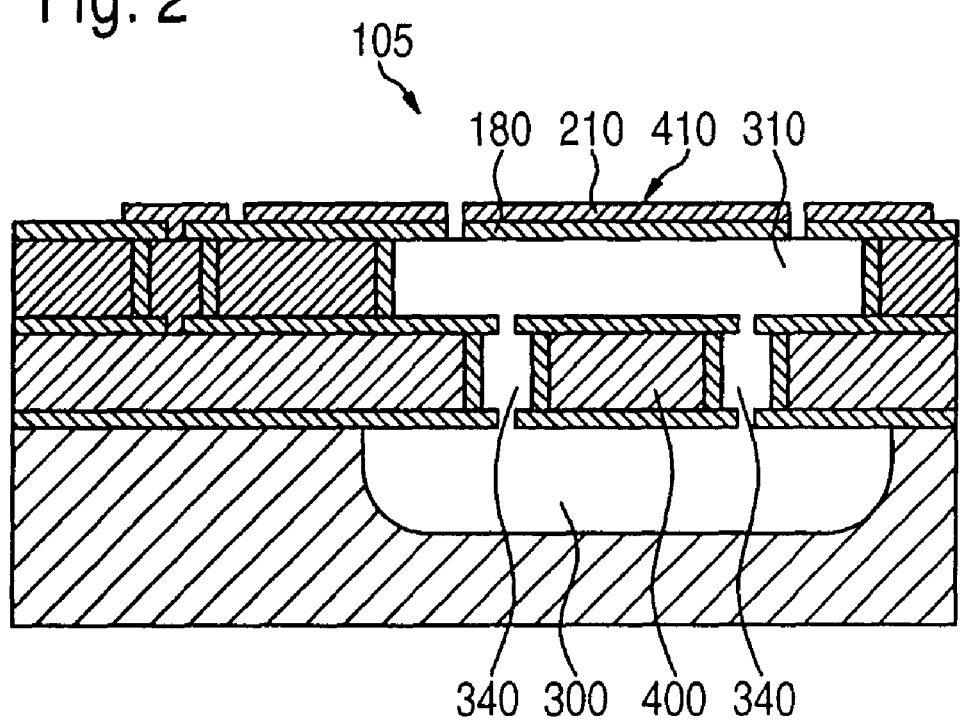
FIG. 2 illustrates the structure of the finished diaphragm sensor.

In FIG. 1g it is shown that through holes 230 through the upper diaphragm and third protective layer 180 down to sacrificial layer 170 are produced as access for the etching medium. As an alternative, it is possible to provide through holes 230 in third protective layer 180 even before depositing second diaphragm layer 210, which, by suitable patterning of second diaphragm layer 210, may be used as access openings for the subsequent etching step. The etching step for the sacrificial layer etching is preferably implemented using gases that etch silicon selectively, for instance fluorine-containing plasmas ($SF_6$, $NF_3$) or, preferably, using spontaneously etching gases such as $ClF_3$ or $XeF_2$. Sacrificial layer 170 between diaphragms 400 and 410, the region(s) 140 that allow(s) access to the substrate, and a portion of silicon substrate 100 lying underneath diaphragm 400 or regions 140 are etched out in the sacrificial layer etching of the etching step.

Through holes 230 may be sealed with the aid of an additional layer in an additional step.

As an alternative, it is also possible to remove only a portion of first diaphragm 400 or only sacrificial layer 170. This may be achieved by placing the through holes in the intermediate oxide layers or protective layers.

To contact first diaphragm 400, it may be provided that region 200 in sacrificial layer 170, which is electrically insulated from the sacrificial layer by the two trenches 205 filled up with oxide, be contactable by an, in particular, metal bond pad 220.

All method steps described allow surface-micromechanical processing of the wafer from the front side. As a result, wafer handling is possible using standardized systems without the need to rotate the wafer. Damage to the fragile micromechanical structures is therefore less likely than with bulk machining processes in which the wafers must be handled on and processed from both sides.

What is claimed is:

1. A method for producing a micromechanical diaphragm sensor having at least one first diaphragm, a second diaphragm essentially disposed above the first diaphragm, a first cavity, and a second cavity essentially disposed above the first cavity, the method comprising:
    producing a first protective layer on a substrate;
    producing at least one opening in the first layer, down to the substrate;
    depositing a first diaphragm layer on the first protective layer;
    patterning the first diaphragm layer;
    producing a second protective layer on at least a portion of the first diaphragm layer;
    producing at least one opening in the second protective layer, down to the first diaphragm layer;
    depositing a sacrificial layer on the second protective layer;
    producing a third protective layer on at least a portion of the sacrificial layer;
    depositing a second diaphragm layer;
    producing at least one opening in the second diaphragm layer and in the third protective layer, down to the sacrificial layer;
    wherein the two cavities are produced in one etching step by dissolving out a portion of the sacrificial layer, the first diaphragm layer, and the substrate.

2. The method of claim 1, wherein both diaphragms are exposed by the single etching step.

3. The method of claim 1, wherein the first cavity in the substrate is produced underneath the openings in the first protective layer, and the second cavity is produced between the first and the second diaphragm.

4. The method of claim 1, wherein at least one of the following is satisfied: (i) the first diaphragm is essentially formed by the first diaphragm layer, and (ii) the second diaphragm is essentially formed by the second diaphragm layer.

5. The method of claim 1, wherein the second and third protective layers restrict the production of the second cavity.

6. The method of claim 1, wherein the first and second protective layers define the extension of the first diaphragm, it being provided, in particular, that the first and second protective layers frame the first diaphragm at least partially.

7. The method of claim 1, wherein at least one of the following is satisfied: (i) the substrate has a silicon semiconductor material, (ii) at least one of the protective layers has a thermal oxide, (iii) the first diaphragm layer has silicon, (iv) the sacrificial layer has Si or SiGe, and (v) the second diaphragm layer has a metal layer.

8. The method of claim 1, wherein at least one of the following is satisfied:
(i) at least one the first and the second diaphragm layer is produced at least one of epitaxially and LPCVD depositionally,
(ii) the second diaphragm layer is produced from a multitude of layers,
(iii) at least one of the first and second diaphragm layer is patterned with a trenching process,
(iv) the etching process is implemented from the front side of the substrate,
(v) the etching process is implemented with a fluorine-containing compound in the form of $SF_6$, $NF_3$, $ClF_3$ or $XeF_2$,
(vi) the thickness of the second protective layer is selected as a function of the diameter of the opening in the first diaphragm layer, the thickness of the second protective layer being greater than one half of the diameter of the openings in the first diaphragm layer,
(vii) the lateral and vertical extension of the first cavity is a function of the etching duration of the etching, and
(viii) the opening in the second diaphragm layer and the opening in the third protective layer are sealed by applying an additional layer.

9. The method of claim 1, wherein the first diaphragm is electrically contacted, wherein the electrical contacting is made by performing the following:
producing an opening down to the first diaphragm layer in the second protective layer;
patterning the sacrificial layer so that an electrically insulated region is produced, wherein the third protective layer largely encloses the electrically insulated region in the sacrificial layer;
producing an opening down to the electrically insulated region in the third protective layer; and
depositing an electrically conductive, spatially restricted layer on the third protective layer in a region of the opening.

10. A micromechanical diaphragm sensor, comprising:
a substrate;
a first diaphragm; and
a second diaphragm disposed essentially above the first diaphragm;

wherein:
a first cavity is situated in the substrate, and wherein a second cavity is disposed between the first and the second diaphragm, the second cavity being situated essentially above the first cavity, wherein both the first and the second diaphragm has material grown on the substrate, and wherein the material is grown epitaxially; and
wherein the substrate, first diaphragm, the second diaphragm, and the first and second cavity are formed by performing the following:
producing a first protective layer on the substrate;
producing at least one opening in the first layer, down to the substrate;
depositing a first diaphragm layer on the first protective layer;
patterning the first diaphragm layer;
producing a second protective layer on at least a portion of the first diaphragm layer;
producing at least one opening in the second protective layer, down to the first diaphragm layer;
depositing a sacrificial layer on the second protective layer;
producing a third protective layer on at least a portion of the sacrificial layer;
depositing a second diaphragm layer; and
producing at least one opening in the second diaphragm layer and in the third protective layer, down to the sacrificial layer;
wherein the two cavities are produced in one etching step by dissolving out a portion of the sacrificial layer, the first diaphragm layer, and the substrate.

11. The micromechanical diaphragm sensor of claim 10, wherein the two diaphragms are deflectable independently of one another.

12. The micromechanical diaphragm sensor of claim 10, wherein at least one opening in the first diaphragm connects the first cavity and the second cavity.

13. The micromechanical diaphragm sensor of claim 10, wherein at least one of (i) the walls of the second cavity and (ii) the opening in the first diaphragm, include an oxide.

14. The micromechanical diaphragm sensor of claim 10, wherein the second diaphragm has a metal layer.

15. The micromechanical diaphragm sensor of claim 10, wherein an electrical contacting of the first diaphragm is provided from the front side of the substrate, an electrically conductive, spatially restricted layer being provided on the surface of the micromechanical diaphragm sensor, which is electrically insulated from the second diaphragm and has an electrical contact to the first diaphragm.

16. The micromechanical diaphragm sensor of claim 10, wherein the second diaphragm has a third protective layer, shared openings being provided in the second diaphragm and the third protective layer, which are sealed by an additional layer above the third protective layer.

* * * * *